United States Patent [19]
Jung et al.

[11] Patent Number: 5,471,150
[45] Date of Patent: Nov. 28, 1995

[54] BUFFER WITH HIGH AND LOW SPEED INPUT BUFFERS

[75] Inventors: Chil-min Jung, Seoul; Kyeong-rae Kim, Kyungki; Jeong-hee Lee, Seoul, all of Rep. of Korea

[73] Assignee: Samsung Electronics Co., Ltd., Suwon, Rep. of Korea

[21] Appl. No.: 171,468

[22] Filed: Dec. 22, 1993

[30] Foreign Application Priority Data

Dec. 30, 1992 [KR] Rep. of Korea ............ 1992-26599

[51] Int. Cl.⁶ ............................................. H03K 19/20
[52] U.S. Cl. ........................ 326/87; 326/27; 326/121
[58] Field of Search ............................ 307/443, 263, 307/451, 475; 326/87, 121, 27

[56] References Cited

U.S. PATENT DOCUMENTS

| | | | |
|---|---|---|---|
| 4,638,187 | 1/1987 | Boler | 307/451 |
| 4,961,010 | 10/1990 | Davis | 307/451 |
| 5,036,222 | 7/1991 | Davis | 307/263 |
| 5,122,690 | 6/1992 | Bianchi | 307/263 |
| 5,315,172 | 5/1994 | Reddy | 307/263 |

*Primary Examiner*—Edward P. Westin
*Assistant Examiner*—Andrew Sanders
*Attorney, Agent, or Firm*—Stephen R. Whitt; Charles R. Donohoe

[57] ABSTRACT

An input buffer includes a low-speed input buffer for buffering an input signal at the time of low-speed operation, a high-speed input buffer being controlled by the low-speed input buffer, for adjusting the high-level and low-level logic of an input signal at the time of high-speed operation and an output driver for outputting high-level or low-level logic by inputting the output signal of the high-speed input buffer. Therefore, there is no direct current present, the operational speed is increased and noise can be reduced.

21 Claims, 3 Drawing Sheets

BUFFER WITH HIGH AND LOW SPEED INPUT BUFFERS

BACKGROUND OF THE INVENTION

The present invention relates to an input buffer, and more particularly, to an input buffer for a semiconductor memory device.

In a conventional input buffer, the threshold value thereof is crucial. Here, high or low logical threshold level is adjusted by regulating the dimensions of a PMOS transistor and NMOS transistor which constitute an inverter. In general, since about 1.5 V (the middle value of typical voltage levels of 0 V and 3 V) is set as the logical threshold level, if an input signal has a transition time of 3 ns, a basic delay of 1.5 ns occurs. Also, the driving capability of the NMOS transistor and PMOS transistor are made to be the same by setting a middle value of the high or low logical threshold level. As a result, the path of direct current is formed about 1.5 V of the input signal and the speed slows down.

FIG. 1 is a circuit diagram of a conventional input buffer.

In FIG. 1, an input signal D is applied for two buffering inverters 1 and 2 to be cascade-connected and a buffered input signal DI is then output.

FIG. 2 shows a result of simulation of the circuit shown in FIG. 1.

In FIG. 2, when an input signal D rises from a low level to a high level, there is a delay of about 0.95 ns. When the input signal D falls from a high level to a low level, there is a delay of about 1.1 ns.

Therefore, in a conventional input buffer, since the logical threshold levels for logic "high" and logic "low" inputs are adjusted by the threshold levels of PMOS transistor and NMOS transistor constituting the inverter, disadvantages are resulted in that speed is decreased and direct current may flow during operation.

SUMMARY OF THE INVENTION

It is an object of the present invention to provide an input buffer which can improve an operational speed by comprising separately each signal path for high-speed and low-speed operation, respectively.

Another object of the present invention is to provide an input buffer which can improve an operational speed by comprising separately each output circuit for logic high and logic low levels, respectively at the time of high-speed operation.

The input buffer to accomplish the first object of the present invention is constituted by a low-speed input buffer for buffering an input signal at the time of low-speed operation, a high-speed input buffer being controlled by the low-speed input buffer, for adjusting the logic high-level and low-level of an input signal at the time of high-speed operation and an output driver for outputting logic high-level or low-level by inputting the output signal of the high-speed input buffer.

The input buffer to accomplish the second object of the present invention is constituted by a low-speed input buffer for buffering an input signal to be output at the time of low-speed operation, a high-speed and logic high-level input buffer being controlled by the low-speed input buffer, for adjusting the logic high-level by buffering the input signal, a high-speed and logic low-level input buffer being controlled by the low-speed input buffer, for adjusting the logic low-level by buffering the input signal at the time of high-speed operation, and an output driver for responding to the outputs of the high-speed and logic high-level input buffer and the high-speed and logic low-level input buffer.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

The input buffer according to the present invention will now be explained with reference to the accompanying drawings.

Figure 1:
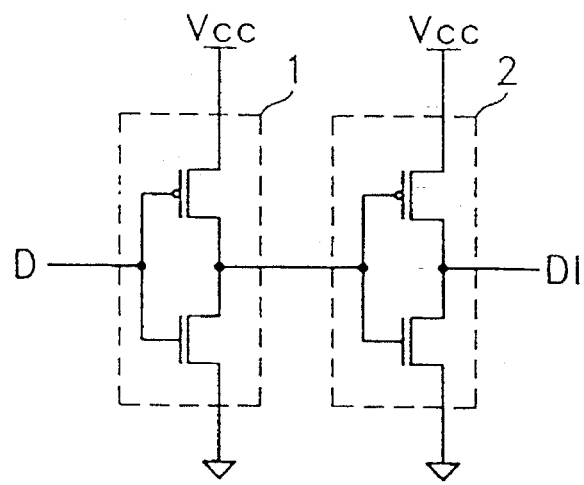
FIG. 1 is a circuit diagram of a conventional input buffer.
Figure 2:
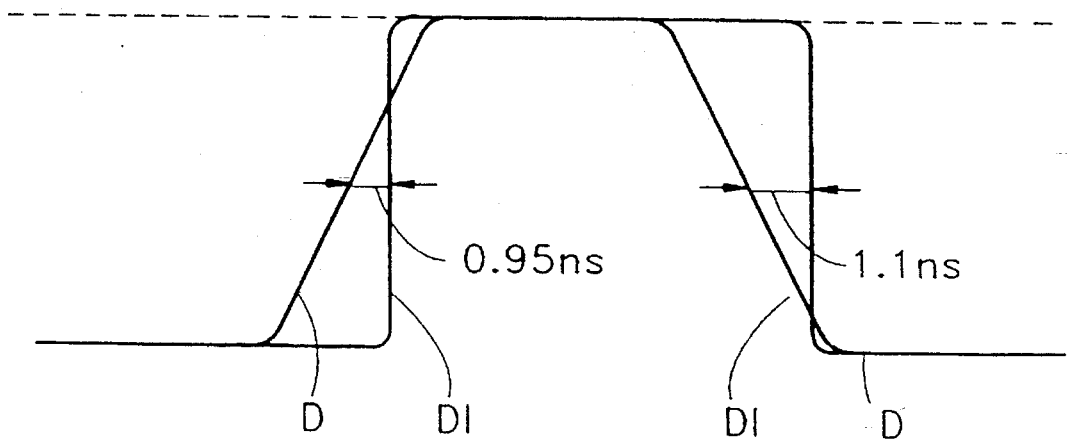
FIG. 2 shows a result of the operational simulation of a conventional input buffer.
Figure 3:
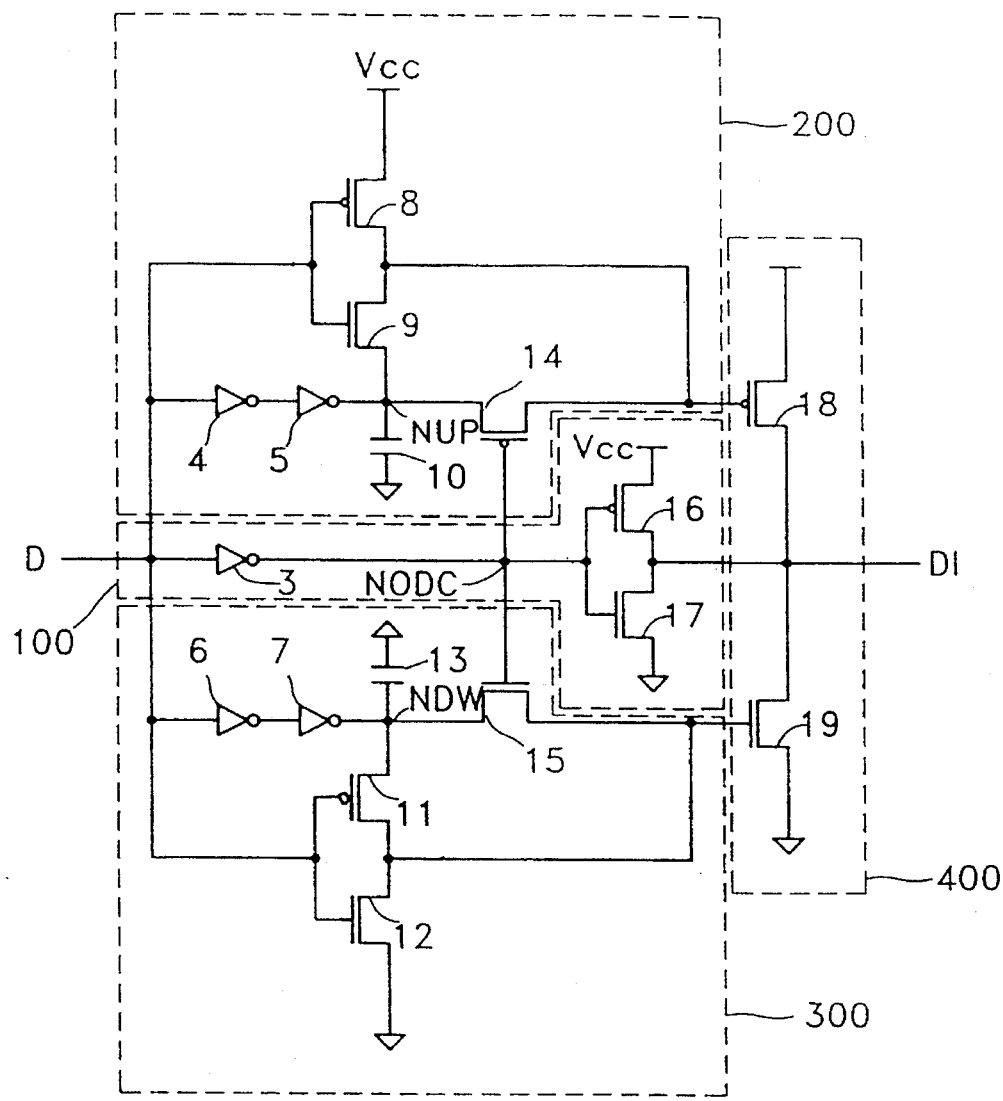
FIG. 3 is a circuit diagram of the input buffer according to the present invention.

FIG. 3 is a circuit diagram of the input buffer according to the present invention.

In FIG. 3, the input buffer includes a low-speed input buffer 100 for buffering an input signal D at the time of low-speed operation, a high-speed and logic high-level input buffer 200 for buffering an input signal D at the time of high-speed operation and adjusting a logic high-level, a high-speed and logic low-level input buffer 300 for buffering an input signal D and adjusting a logic low-level at the time of high-speed operation, and an output driver 400 being disabled at the time of the operation of the low-speed input buffer 100 and enabled at the time of the operation of the high-speed input buffers 200 and 300, for outputting a logic high-level or low-level.

The low-speed input buffer 100 is constituted by an inverter 3 for receiving an input signal D and inverting the applied input signal, a PMOS transistor 16 having a gate electrode connected to the output of the inverter 3 and a source electrode connected to a power voltage, and a NMOS transistor 17 having a gate electrode connected to the output of the inverter 3, a source electrode connected to ground potential and a drain electrode connected to the drain electrode of the PMOS transistor 16.

The high-speed input buffer is constituted by a logic high-level threshold adjusting means 200 for input signal D and a logic low-level threshold adjusting means 300 for input signal D.

The logic high-level threshold adjusting means 200 is constituted by inverters 4 and 5 for buffering the input signal D, a PMOS transistor 8 having a source electrode connected to a power voltage and a gate electrode receiving input signal D, an NMOS transistor 9 having a drain electrode connected to the drain electrode of PMOS transistor 8, a gate electrode receiving input signal D and a source electrode connected to the output of the inverter 5, a capacitor 10 connected between the output of the inverter 5 and ground and a PMOS transistor 14 having a gate electrode connected to the output of the inverter 3, a source electrode connected to the output of the inverter 5 and a drain electrode connected to the drain electrode of PMOS transistor 8.

The logic low-level threshold adjusting means 300 is constituted by inverters 6 and 7 for buffering the input signal D, a PMOS transistor 11 having a gate electrode receiving input signal D and a source electrode connected to the output of the inverter 7, a NMOS transistor 12 having a gate electrode receiving input signal D, a source electrode connected to ground and a drain electrode connected to the drain electrode of PMOS transistor 11, a capacitor 13 connected between the output of the inverter 7 and a power voltage, and an NMOS transistor 15 having a gate electrode connected to the output of the inverter 3, a drain electrode connected to the output of the inverter 7 and a source electrode connected to the drain electrode of PMOS transistor 11.

The output driver 400 is constituted by a PMOS transistor 18 having a gate electrode connected to the drain electrode of PMOS transistor 8 and a source electrode connected to a power voltage and an NMOS transistor 19 having a gate electrode connected to the drain electrode of PMOS transistor 11, a source electrode connected to ground, a drain electrode commonly connected to the drain electrodes of PMOS transistor 16 and PMOS transistor 18 and an output terminal DI.

The aforementioned configuration should satisfy the following conditions for the operation of the present invention.

First, the logic threshold level of inverter 4 should be set to be lower than that of PMOS transistor 8 and NMOS transistor 9, and the logic threshold level of inverter 6 should be set to be higher than that of PMOS transistor 11 and NMOS transistor 12.

Second, the logic threshold level of inverter 4 should be set to be the lowest, of the inverters 3, 4, and 6 the logic threshold level of inverter 6 should be set to be highest in this group and the logic threshold level of inverter 3 should be set in the middle range between those of inverters 4 and 6.

Third, the dimensions of transistors 18 and 19 of output driver 400 should be big enough to drive the loads of subsequent stages.

Fourth, dimensions of PMOS transistor 16 and NMOS transistor 17 should be relatively small.

The operation according to the above configuration will now be described.

Low speed operation will first be explained as follows:

When input signal D makes a transition from a low level to a high level, the logic threshold level of inverter 4 is lower than that of PMOS transistor 8 and NMOS transistor 9. Therefore, before only NMOS transistor 9 among NMOS transistor 9 anti PMOS transistor 8 is turned on, a node NUP makes a transition to a high level. Also, when input signal D makes a transition from a high level to a low level, logic threshold level of the inverter 6 is higher than that of PMOS transistor 11 and NMOS transistor 12. Therefore, before only PMOS transistor 11 among PMOS transistor 11 and NMOS transistor 12 is turned on, a node NDW makes a transition to a low level. That is to say, in the logic high-level input buffer 200, even if PMOS transistor 8 or NMOS transistor 9 are turned on, since state of the inverter 4 is transferred at the lower voltage, node NUP becomes high and PMOS transistor 18 does not turn on. Also, in the logic low-level input buffer 300, before PMOS transistor 11 and NMOS transistor 12 are turned since the state of inverter 6 is transferred by the higher voltage, node NDW becomes low and NMOS transistor 19 does not turn on. Accordingly, for low-speed operation, the logic threshold level of the low-speed input buffer 100 is determined by the logic threshold level of the inverter 3 and small dimensional PMOS transistor 16 and NMOS transistor 17.

Figure 4:
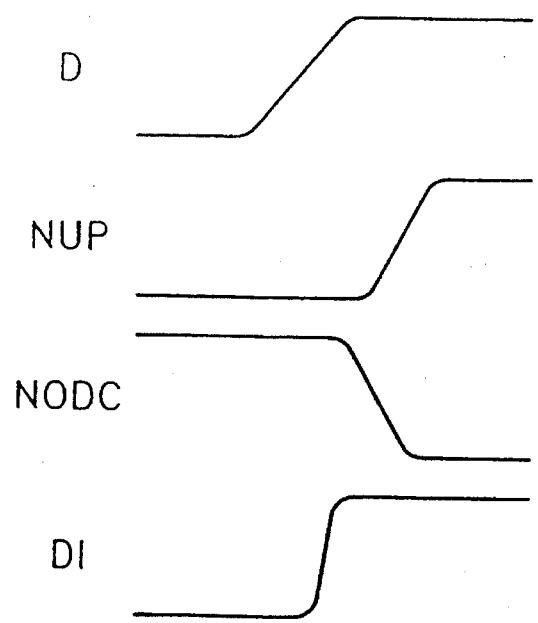
FIG. 4 is an operational timing diagram for explaining the operation of the circuit shown in FIG. 3 where an input signal makes a transition rapidly from a low level to a high level.

Next, high speed operation will be explained as follows:

FIG. 4 is an operational timing chart illustrating the operation of the circuit shown in FIG. 3 where input signal D makes a rapid transition from low level to high level.

In FIG. 4, when input signal D makes transition from low level to high level, the logic high-level threshold adjusting means 200 operates. Since charge is not accumulated in capacitor 10 when input signal D is at a low-level signal, the node NUP becomes low. On the other hand, when input signal D makes a transition to a high level, the drain electrode of NMOS transistor 9 becomes low so that PMOS transistor 18 is turned on. Also, at this time, since the output signal NODC of inverter 3 is low, PMOS transistor 14 is turned on. Since output of the inverter 5 is high, node NUP becomes high after a fixed delay time. The high-level signal is transmitted via PMOS transistor 14 to turn PMOS transistor 18 off. In other words, when input signal D goes high, PMOS transistor 18 of output driver 400 is turned on for a predetermined time and then turned off to let NMOS transistor 19 stop operating.

Figure 5:
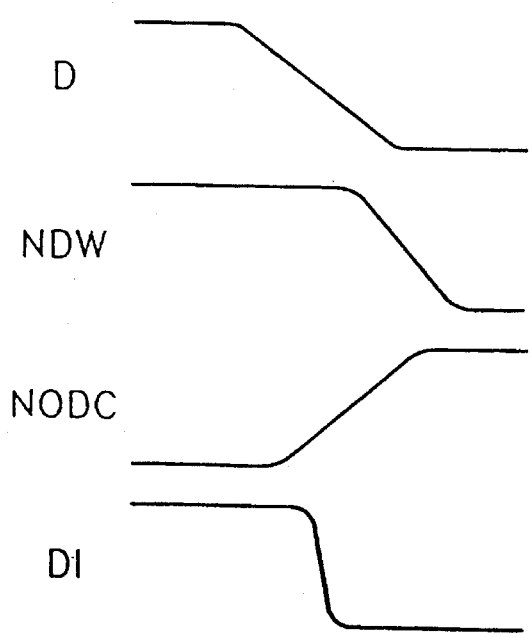
FIG. 5 is an operational timing diagram for explaining the operation of the circuit shown in FIG. 3 where an input signal makes a transition rapidly from a high level to a low level.

FIG. 5 is an operational timing diagram illustrating the operation of the circuit shown in FIG. 3 where an input signal makes a rapid transition from high level to low level.

In FIG. 5, when input signal D makes a transition from high to low, the logic low-level threshold adjusting means 300 operates. Since charge is accumulated in capacitor 13 in the case of a high-level signal, node NDW becomes high. On the other hand, when input signal D makes a transition to a low level, the drain electrode of PMOS transistor 11 becomes high so that NMOS transistor 19 is turned on. Also, at this time, since output signal NODC of inverter 3 is a high level, the NMOS transistor 15 is turned on. Since the output signal of inverter 7 is low, node NDW becomes low after a fixed delay time. The low-level signal is transmitted via NMOS transistor 15 to turn NMOS transistor 19 off. In other words, when input signal D goes low, NMOS transistor 19 of output driver 400 is turned on for a predetermined time and then turned off to let PMOS transistor 18 stop operating.

Also, the low-speed input buffer operates at the time of a high speed operation but does not affect an output signal DI and maintains the "ON" states of transistors 18 and 19 since the driving capability of the transistors 18 and 19 of output driver 400 is larger than that of PMOS transistor 16 and NMOS transistor 17.

Figure 6:
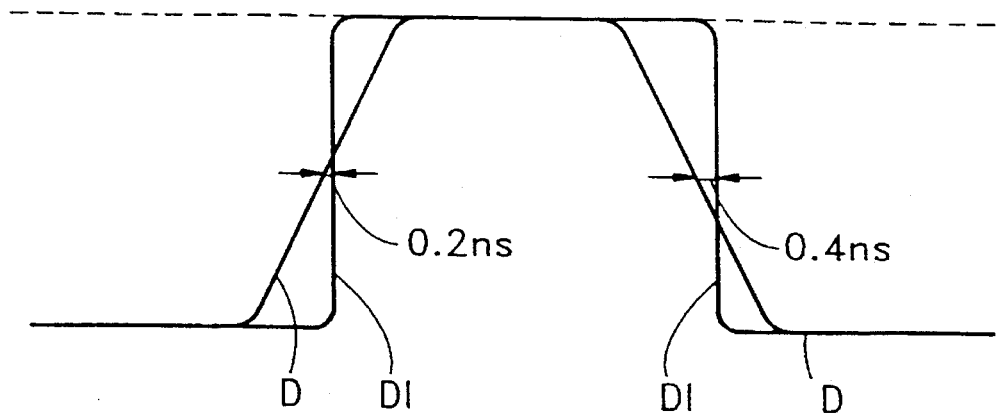
FIG. 6 shows a result of the operational simulation of the circuit shown in FIG. 3.

FIG. 6 shows the result of an operational simulation of the circuit shown in FIG. 3.

In FIG. 6, when input signal D rises from low level to high level, the signal is delayed by about 0.2 ns. When input signal D falls from high level to low level, the signal is delayed by about 0.4 ns. That is to say, the circuit according to the present invention is faster than the conventional circuit by about 0.75 ns in the case of a rising input signal D and is slower by about 0.7 ns in the case of a falling input signal D.

Therefore, the operational speed of the input bluffer of the present invention is increased by separating the low-speed and high-speed operations.

Also, since direct current does not flow during low speed operation, the current consumption is reduced anti speed can be improved.

Furthermore, the probability of system malfunction due to noise is low because neither of the transistors 18 and 19 is turned on and operated by only small dimensional transistors such as transistors 16 and 17, for the system noise having a period of more than 5 ns.

What is claimed is:

1. An input buffer comprising:

a low-speed input buffer receiving an input signal and generating a buffered output signal during low-speed operation;

a high-speed, logically high input buffer controlled by the low-speed input buffer, receiving the input signal, and generating a logically high output signal during high-speed operation;

a high-speed, logically low input buffer controlled by the low-speed input buffer, receiving the input signal, and generating a logically low output signal during high-speed operation; and an output driver exclusively receiving the logically high output signal and the logically low output signal, and generating an output signal in response thereto.

2. An input buffer as claimed in claim 1, wherein said low-speed input buffer comprises:

a first inverter receiving said input signal and inverting said input signal;

a first pull-up transistor having a gate electrode connected to the inverted output of said first inverter, a source electrode connected to a power voltage, and a drain electrode; and a first pull-down transistor having a gate electrode connected to the inverted output of the first inverter, a source electrode connected to ground, and a drain electrode connected to the drain electrode of the first pull-up transistor.

3. An input buffer comprising:

a low-speed input buffer receiving an input signal, generating a buffered output signal during low-speed operation, and comprising;

a first inverter receiving the input signal and inverting the input signal;

a first pull-up transistor having a gate electrode connected to the inverted output of the first inverter, a source electrode connected to a power voltage, and a drain electrode; and a first pull-down transistor having a gate electrode connected to the inverted output of the first inverter, a source electrode connected to ground, and a drain electrode connected to the drain electrode of the first pull-up transistor;

a high-speed, logically high input buffer controlled by the low-speed input buffer, receiving the input signal, generating a logically high output signal during high-speed operation, and comprising;

second and third inverters receiving the input signal;

a second pull-up transistor having a source electrode connected to the power voltage, a gate electrode receiving the input signal, and a drain electrode;

a second pull-down transistor having a drain electrode connected to the drain electrode of the second pull-up transistor, a gate electrode receiving the input signal, and a source electrode connected to an output of the third inverter;

a capacitor connected across the output of the third inverter and ground; and a first pass transistor having a gate electrode connected to the output of the first inverter, a source electrode connected to the output of the third inverter, and a drain electrode connected to the drain electrode of the second pull-up transistor;

a high-speed, logically low input buffer controlled by the low-speed input buffer, receiving the input signal, and generating a logically low output signal during high-speed operation; and an output driver at which the output of the high-speed, logically high input buffer, and the output of the high-speed, logically low input buffer are apparent.

4. An input buffer as claimed in claim 3, wherein logic threshold levels for the second pull-up transistor and the second pull-down transistor are set to be higher than the logic threshold level of the second inverter.

5. An input buffer as claimed in claim 3, wherein logic threshold levels for the second pull-up transistor and the second pull-down transistor are set to be lower than the logic threshold level of the first inverter.

6. An input buffer as claimed in claim 3, wherein the high-speed, logically low input buffer comprises:

fourth and fifth inverters receiving the input signal;

a fourth pull-up transistor having a gate electrode receiving the input signal, a source electrode connected to an output of the fifth inverter, and a drain electrode;

a third pull-down transistor having a gate electrode receiving the input signal, a source electrode connected to ground, and a drain electrode connected to the drain electrode of the fourth pull-up transistor;

a capacitor connected across the output of the fifth inverter and a power voltage; and a second pass transistor having a gate electrode connected to the output of the first inverter, a drain electrode connected to the output of first inverter, and a source electrode connected to the drain electrode of the fourth pull-up transistor.

7. An input buffer as claimed in claim 6, wherein logic threshold levels of the fourth pull-up transistor and the third pull-down transistor are set to be lower than the logic threshold level of the fourth inverter.

8. An input buffer as claimed in claim 6, wherein logic threshold levels of the fourth pull-up transistor and the third pull-down transistor are set to be higher than the logic threshold level of the first inverter.

9. An input buffer as claimed in claim 6, wherein said output driver comprises:

a fifth pull-up transistor having a gate electrode connected to the drain electrode of the second pull-up transistor, a source electrode connected to a power voltage, and a drain electrode; and a fifth pull-down transistor having a gate electrode connected to the drain electrode of the fourth pull-up transistor, a source electrode connected to ground, a drain electrode commonly connected to the drain electrodes of the fifth pull-up transistor, the first pull-up transistor, and an output terminal.

10. An input buffer as claimed in claim 9, wherein dimensions of the fifth pull-up transistor and the fifth pull-down transistor are larger than the dimensions of the first pull-up transistor and the first pull-down transistor.

11. An input buffer comprising:
a low-speed input buffer receiving an input signal during low-speed operation;
a high-speed input buffer, controlled by the low-speed input buffer, adjusting high-level and low-level logic of the input signal during high-speed operation, and providing the adjusted input signal as an output; and
an output driver, exclusively receiving the adjusted input signal, and generating high-level and low-level logic signals in response to the output of the high-speed input buffer.

12. An input buffer as claimed in claim 11, wherein said low-speed input buffer comprises:
a first inverter receiving inverting the input signal;
a first pull-up transistor having a gate electrode connected to the output of the first inverter, a source electrode connected to a power voltage, and a drain electrode; and
a first pull-down transistor having a gate electrode connected to the output of the first inverter, a source electrode connected to ground potential, and a drain electrode connected to the drain electrode of the first pull-up transistor.

13. An input buffer as claimed in claim 11, wherein said high-speed input buffer comprises:
high-level logic adjusting means for adjusting a high-level logic value for the input signal; and
low-level logic adjusting means for adjusting a low-level logic value for the input signal.

14. An input buffer comprising:
a low-speed input buffer receiving an input signal during low-speed operation, and comprising;
a first inverter receiving inverting the input signal;
a first pull-up transistor having a gate electrode connected to the output of the first inverter, a source electrode connected to a power voltage, and a drain electrode; and
a first pull-down transistor having a gate electrode connected to the output of the first inverter, a source electrode connected to ground potential, and a drain electrode connected to the drain electrode of the first pull-up transistor;
a high-speed input buffer, controlled by the low-speed input buffer, adjusting high-level and low-level logic of the input signal during high-speed operation, providing the adjusted input signal as an output, and comprising;
high-level logic adjusting means for adjusting a high-level logic value for the input signal; and
low-level logic adjusting means for adjusting a low-level logic value for the input signal, wherein the high-level logic adjusting means further comprises;
second and third inverters receiving the input signal;
a second pull-up transistor having a source electrode connected to a power voltage, a gate electrode receiving the input signal, and a drain electrode;
a second pull-down transistor having a drain electrode connected to the drain electrode of the second pull-up transistor, a gate electrode receiving the input signal, and a source electrode connected to the output of the third inverter;
a capacitor connected across the output of the third inverter and ground; and
a first pass transistor having a gate electrode connected to the output of the first inverter, a source electrode connected to the output of the third inverter, and a drain electrode connected to the drain electrode of the second pull-up transistor;
an output driver generating the high-level and low-level logic signals in response to the output of the high-speed input buffer.

15. An input buffer as claimed in claim 14, wherein logic threshold levels of the second pull-up transistor and the second pull-down transistor are set to be higher than the logic threshold level of the second inverter.

16. An input buffer as claimed in claim 14, wherein logic threshold levels of the second pull-up transistor and the second pull-down transistor are set to be higher than the logic threshold level of the first inverter.

17. An input buffer as claimed in claim 14, wherein said logic low-level adjusting means comprises:
fourth and fifth inverters receiving the input signal;
a fourth pull-up transistor having a gate electrode receiving the input signal, a source electrode connected to the output of the fifth inverter, and a drain electrode;
a third pull-down transistor having a gate electrode receiving the input signal, a source electrode connected to ground, and a drain electrode connected to the drain electrode of the fourth pull-up transistor;
a capacitor connected across the output of the fifth inverter and a power voltage; and
a second pass transistor having a gate electrode connected to the output of the first inverter, a drain electrode connected to the output of the first inverter, and a source electrode connected to the drain electrode of the fourth pull-up transistor.

18. An input buffer as claimed in claim 17, wherein logic threshold levels of the fourth pull-up transistor and the third pull-down transistor are set to be lower than that of the fourth inverter.

19. An input buffer as claimed in claim 17, wherein logic threshold levels of the fourth pull-up transistor and the third pull-down transistor are set to be higher than that of the first inverter.

20. An input buffer as claimed in claim 14, wherein said output driver comprises:
a fifth pull-up transistor having a gate electrode connected to the drain electrode of the second pull-up transistor, a source electrode connected to a power voltage, and a drain electrode; and
a fifth pull-down transistor having a gate electrode connected to the drain electrode of the fourth pull-up transistor, a source electrode connected to ground, a drain electrode commonly connected to the drain electrodes of the fifth pull-up transistor, the first pull-up transistor, and an output terminal.

21. An input buffer as claimed in claim 20, wherein dimensions of the fifth pull-up transistor and the fifth pull-down transistor are larger than those of the first pull-up transistor and the first pull-down transistor.

* * * * *